(12) United States Patent
Marui et al.

(10) Patent No.: US 9,876,070 B2
(45) Date of Patent: Jan. 23, 2018

(54) SEMICONDUCTOR DEVICE AND METHOD FOR MANUFACTURING SAME

(71) Applicant: NISSAN MOTOR CO., LTD., Yokohama-shi, Kanagawa (JP)

(72) Inventors: Toshiharu Marui, Yokohama (JP); Tetsuya Hayashi, Yokosuka (JP); Shigeharu Yamagami, Blacksburg, VA (US); Wei Ni, Yokohama (JP); Kenta Emori, Yokosuka (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 0 days.

(21) Appl. No.: 14/436,799

(22) PCT Filed: Oct. 17, 2013

(86) PCT No.: PCT/JP2013/078145
§ 371 (c)(1),
(2) Date: Apr. 17, 2015

(87) PCT Pub. No.: WO2014/061724
PCT Pub. Date: Apr. 24, 2014

(65) Prior Publication Data
US 2015/0287775 A1    Oct. 8, 2015

(30) Foreign Application Priority Data
Oct. 19, 2012  (JP) ................ 2012-231401

(51) Int. Cl.
*H01L 29/66* (2006.01)
*H01L 29/06* (2006.01)
*H01L 29/861* (2006.01)
*H01L 29/417* (2006.01)
*H01L 29/16* (2006.01)
*H01L 29/872* (2006.01)
*H01L 29/165* (2006.01)
*H01L 21/265* (2006.01)
(Continued)

(52) U.S. Cl.
CPC ...... *H01L 29/063* (2013.01); *H01L 21/26513* (2013.01); *H01L 21/308* (2013.01);
(Continued)

(58) Field of Classification Search
CPC ......... H01L 21/30604; H01L 27/26513; H01L 29/063
See application file for complete search history.

(56) References Cited

U.S. PATENT DOCUMENTS

| 8,896,084 B2 | 11/2014 | Sugawara |
| 2004/0164304 A1 | 8/2004 | Magri et al. |

(Continued)

FOREIGN PATENT DOCUMENTS

| JP | 4-065876 A | 3/1992 |
| JP | 5-75100 A | 3/1993 |

(Continued)

*Primary Examiner* — Bradley K Smith
(74) *Attorney, Agent, or Firm* — Foley & Lardner LLP

(57) ABSTRACT

A semiconductor device (100) comprises: a semiconductor substrate (1); a drift region (2) of a first conductivity type having a trench in part of an upper portion thereof and arranged on a first main surface of the semiconductor substrate (100); an electric field reducing region (4) of a second conductivity type arranged, in a bottom portion of the trench, only around a corner portion and not in a center portion; an anode electrode (9) embedded in the trench; and a cathode electrode (10) arranged on a second main surface of the semiconductor substrate (100) which is opposite to the first main surface.

10 Claims, 20 Drawing Sheets

(51) Int. Cl.
*H01L 21/306* (2006.01)
*H01L 21/308* (2006.01)
*H01L 29/47* (2006.01)

(52) U.S. Cl.
CPC ........ *H01L 21/30604* (2013.01); *H01L 29/06* (2013.01); *H01L 29/0615* (2013.01); *H01L 29/0619* (2013.01); *H01L 29/165* (2013.01); *H01L 29/1608* (2013.01); *H01L 29/417* (2013.01); *H01L 29/6606* (2013.01); *H01L 29/66136* (2013.01); *H01L 29/861* (2013.01); *H01L 29/872* (2013.01); *H01L 29/47* (2013.01)

(56) References Cited

U.S. PATENT DOCUMENTS

2006/0003518 A1* 1/2006 Harter ............... H01L 21/76843
438/222
2012/0313212 A1* 12/2012 Sugawara ........... H01L 29/0615
257/471

FOREIGN PATENT DOCUMENTS

| JP | 5-075100 A | 3/1993 |
| JP | 2003-115597 A | 4/2003 |
| JP | 2007-128926 A | 5/2007 |
| JP | 2011-238831 A | 11/2011 |
| JP | 2012-129299 A | 7/2012 |
| WO | WO 2011/105434 A1 | 9/2011 |

* cited by examiner

SEMICONDUCTOR DEVICE AND METHOD FOR MANUFACTURING SAME

TECHNICAL FIELD

The present invention relates to a rectifying semiconductor device having a trench structure and a method for manufacturing the same.

BACKGROUND ART

Various types of semiconductor devices are proposed to improve characteristics of rectifying semiconductor devices. For example, there is proposed a method of reducing an electric field in corner portions of a trench bottom portion of a semiconductor device by implanting ions into the entire trench bottom portion (for example, see Patent Document 1). The withstand voltage of the semiconductor device can be improved by arranging a region for reducing an electric field (hereafter, referred to as "electric field reducing region") in the trench bottom portion.

CITATION LIST

Patent Literature

Patent Literature 1: Japanese Patent Application Publication No. 2007-128926

SUMMARY OF INVENTION

However, when the electric field reducing region is arranged in the trench bottom portion, a region of the semiconductor device through which a current flows is limited. This is because the current does not flow through the electric field reducing region which has high resistance due to ion implantation, and the current is reduced by an amount of a current which could not flow through the trench bottom portion. As a result, such a semiconductor device has a problem that the forward current of the semiconductor device decreases.

In view of the problem described above, an object of the present invention is to provide a semiconductor device in which decrease of the forward current is suppressed with an electric field reducing region being formed in a trench bottom portion to improve the withstand voltage, and a method for manufacturing the same.

A semiconductor device according to one aspect of the present invention comprises: a drift region of a first conductivity type arranged on a first main surface of a semiconductor substrate and having a surface in which a trench is formed; an electric field reducing region of a second conductivity type arranged around a corner portion of a trench bottom portion; an anode electrode embedded in the trench; and a cathode electrode arranged on a second main surface of the semiconductor substrate.

DESCRIPTION OF EMBODIMENTS

Figure 1:
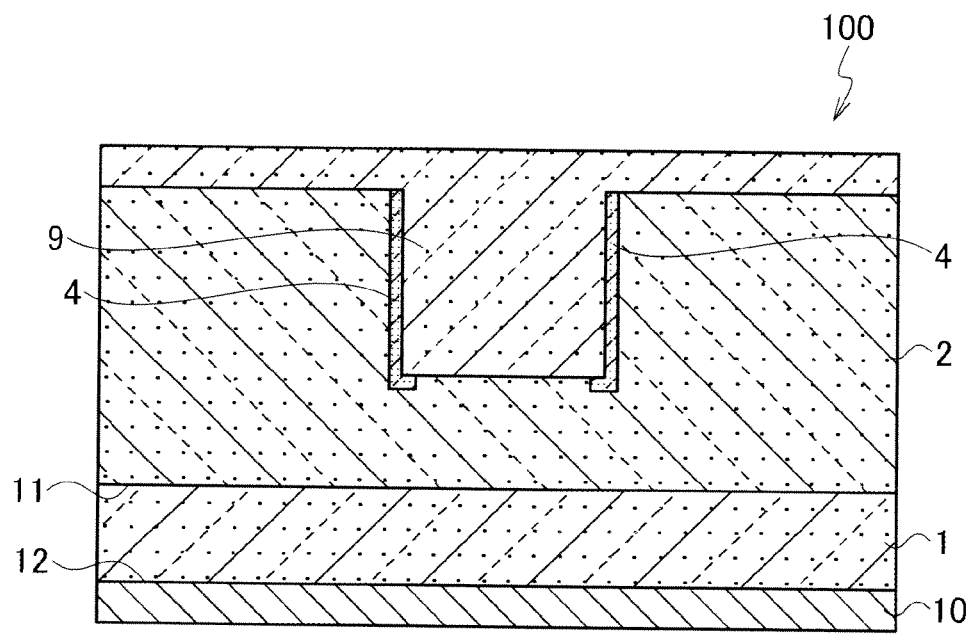
FIG. 1 is a schematic cross-sectional view showing a configuration of a semiconductor device in a first embodiment of the present invention.

Next, embodiments of the present invention are described with reference to the drawings. In the illustrations of the following drawings, the same or similar parts are denoted by the same or similar reference numerals. Note that the drawings are schematic and relationships between the thicknesses and the plan dimensions, ratios of the thicknesses of respective layers, and the like are different from actual ones. Accordingly, specific thicknesses and dimensions should be determined in consideration of the descriptions below. Moreover, parts where relations and proportions of the dimensions are different among the drawings are included as a matter of course.

Moreover, the embodiments described below shows examples of devices and methods which embody the technical spirit of the invention, and materials, shapes, structures, arrangements, and the like of constitutional parts are not specified by the embodiments of the present invention to those described below. Various changes can be made to the embodiments of the present invention within the scope of claims.

First Embodiment

As shown in FIG. 1, a semiconductor device 100 in a first embodiment of the present invention includes a semiconductor substrate 1, a drift region 2 of a first conductivity type, and an electric field reducing region 4 of a second conductivity type. The drift region 2 has a trench in part of an upper portion thereof and is arranged on a first main surface 11 of the semiconductor substrate 1. In a bottom portion of the trench formed in the drift region 2, the electric field reducing region 4 is arranged only around corner portions of the bottom portion and not in a center portion. The electric field reducing region 4 is arranged in peripheries of side surfaces of the trench but is not arranged in peripheries of regions in the bottom portion of the trench other than the corner portions.

The first conductivity type and the second conductivity type are conductivity types opposite to each other. Specifically, when the first conductivity type is N type, the second conductivity type is P type, and when the first conductivity type is P type, the second conductivity type is N type. A case where the first conductivity type is N type and the second conductivity type is P type is described below as an example. Note that the semiconductor substrate 1 is a high-concentration N type silicon carbide (SIC) substrate and the drift region 2 is a low-concentration N type SiC layer.

As shown in FIG. 1, the trench formed in the drift region 2 extends toward the semiconductor substrate 1 with an opening portion formed on a surface of the drift region 2. The bottom portion of the trench is located inside the drift region 2 and the trench does not reach the semiconductor substrate 1.

An anode electrode 9 is formed to be embedded into the trench and is arranged also on a top surface of the drift region 2. Meanwhile, a cathode electrode 10 is arranged on a second main surface 12 of the semiconductor substrate 1 which is opposite to the first main surface 11.

Figure 2:
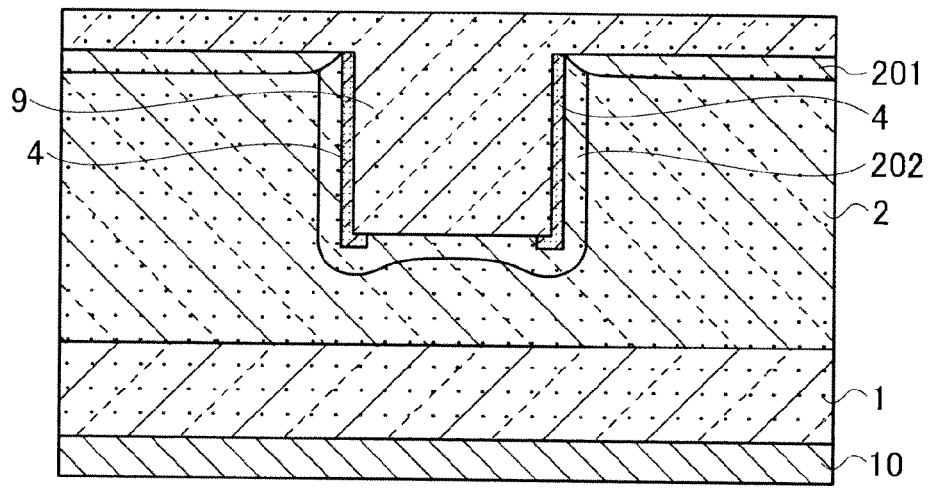
FIG. 2 is a schematic cross-sectional view for explaining an operation of the semiconductor device shown in FIG. 1 in an off state.
Figure 3:
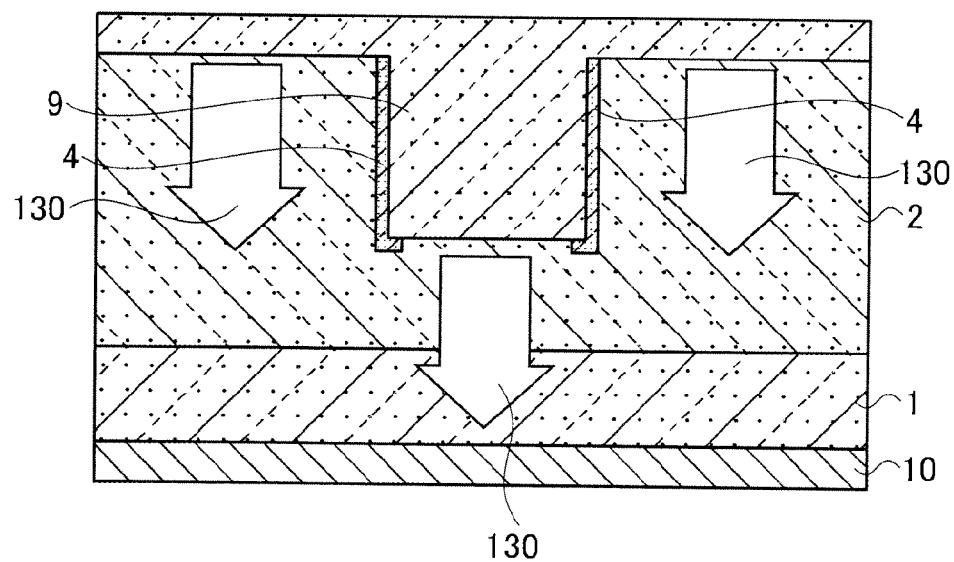
FIG. 3 is a schematic cross-sectional view for explaining an operation of the semiconductor device shown in FIG. 1 in an on state.

Basic operations of the semiconductor device 100 shown in FIG. 1 are described below with reference to FIGS. 2 and 3.

In a state where a positive voltage is applied to the cathode electrode 10 with the anode electrode 9 being a reference (hereafter, referred to as "off state"), electrons on the anode electrode 9 side are blocked by an energy barrier generated between a semiconductor region and the anode electrode 9 and do not move to the semiconductor region side. Accordingly, no current normally flows in the semiconductor device 100 in the off state. An operation in this case is described with reference to FIG. 2. When the positive voltage is applied to the cathode electrode 10 with the anode electrode 9 being the reference, the electrons on the anode electrode side are blocked by the barrier between the semiconductor region and the anode electrode 9 and do not move to the semiconductor region side. Due to this, no current normally flows. However, a reverse leakage current flows from a portion of the cathode electrode 10 where the electric field concentration occurs toward the anode electrode 9. In a diode having a trench structure, an electric field concentrates at a trench end and the reverse leakage current flows therethrough. Meanwhile, in the structure of the first embodiment, since the electric field reducing region 4 of the second conductivity type is provided at the trench end, a depletion layer 202 spreads from the electric field reducing region 4 of the second conductivity type as shown in FIG. 2, and the electric field at the trench end is thereby reduced. Moreover, since the depletion layer 202 spreading from the electric field reducing region 4 also spreads to the trench bottom, the electric field in the entire bottom portion can be also reduced. Note that, as shown in FIG. 2, a depletion layer 201 also spreads from a top surface of the anode electrode 9 into the drift region 2.

Meanwhile, in a state where a negative voltage is applied to the cathode electrode 10 with the anode electrode 9 being the reference (hereafter, referred to as "on state"), electrons in the semiconductor region such as the drift region 2 move toward the anode electrode 9 and a current flows from the anode electrode 9 to the cathode electrode 10. An operation in this case is described with reference to FIG. 3. When the negative voltage is applied to the cathode electrode 10 with the anode electrode 9 being the reference, the electrons on the semiconductor side move to the anode electrode 9 side, and a forward current 130 flows from the anode electrode 9 to the cathode electrode 10. At this time, since there is no electric field reducing region 4 of the second conductivity type in the center portion of the trench bottom portion, the forward current 130 can flow through the center portion of the trench bottom portion as shown in FIG. 3.

Next, an example of a method for manufacturing the semiconductor device 100 is described with reference to FIGS. 4 to 11.

Figure 4:
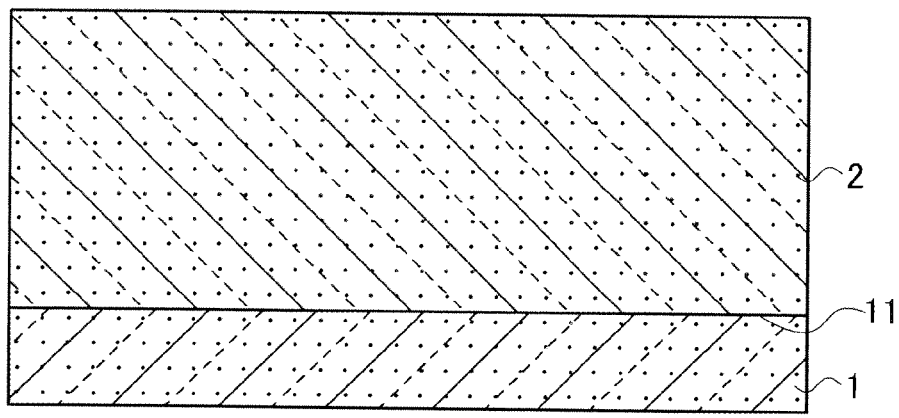
FIG. 4 is a cross-sectional view which shows a manufacturing step and which is used to explain a method for manufacturing the semiconductor device in the first embodiment.

First, as shown in FIG. 4, the drift region 2 made of N− type silicon carbide is formed by epitaxial growth on the first main surface 11 of the semiconductor substrate 1 made of N+ type silicon carbide.

Figure 5:
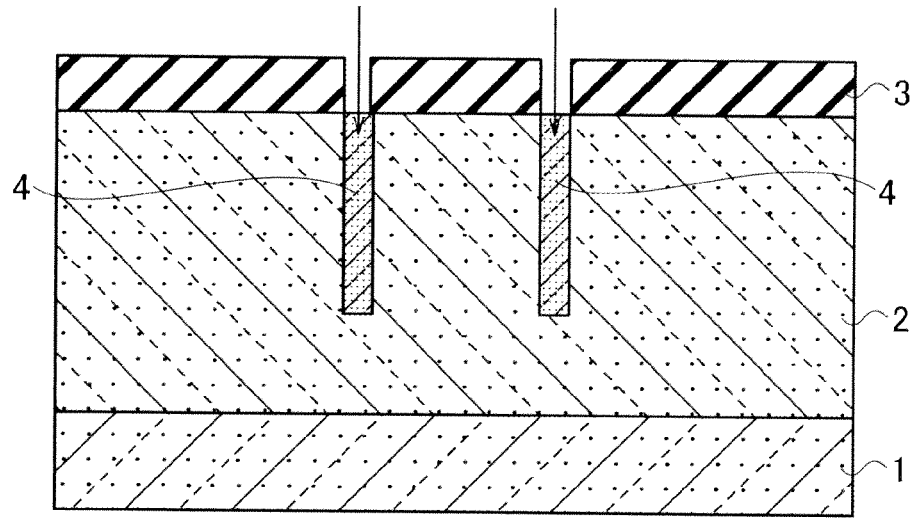
FIG. 5 is a cross-sectional view for explaining a manufacturing step performed after FIG. 4 in the method for manufacturing the semiconductor device in the first embodiment.

Next, the electric field reducing region 4 is formed in the drift region 2. Specifically, as shown in FIG. 5, an oxide film is formed on the top surface of the drift region 2 and is patterned to be formed into an etching mask 3 in which the oxide film above a portion where the electric field reducing region 4 is to be formed is selectively removed. Then, ions of a P type impurity are implanted into the drift region 2 as shown by the arrows in FIG. 5 by using the etching mask 3 as a mask, and the electric field reducing region 4 is thereby formed. Note that the electric field reducing region 4 is formed to surround the portion of the drift region 2 as viewed in a direction parallel to the normal line of the first main surface 11 of the semiconductor substrate 1. For example, the shape of the portion of the drift region 2 surrounded by the electric field reducing region 4 is a rectangle in a view from above.

Aluminum (Al), Boron (B), and the like are used as the P type impurity of the electric field reducing region 4. Crystal defects can be prevented from occurring in the region where the impurity ions are implanted by setting the substrate temperature to about 600° C. and implanting the ions with the drift region 2 being heated in the formation of the electric field reducing region 4.

Note that a general photolithography technique can be used for the pattering of the oxide film. Specifically, the oxide film on the drift region 2 is etched by using, as a mask, a photoresist film formed on the oxide film by patterning. Wet etching using hydrofluoric acid, dry etching such as reactive ion etching, or the like can be employed as the etching method. After the oxide film is patterned, the photoresist film is removed by using oxygen plasma, sulfuric acid, or the like.

Figure 6:
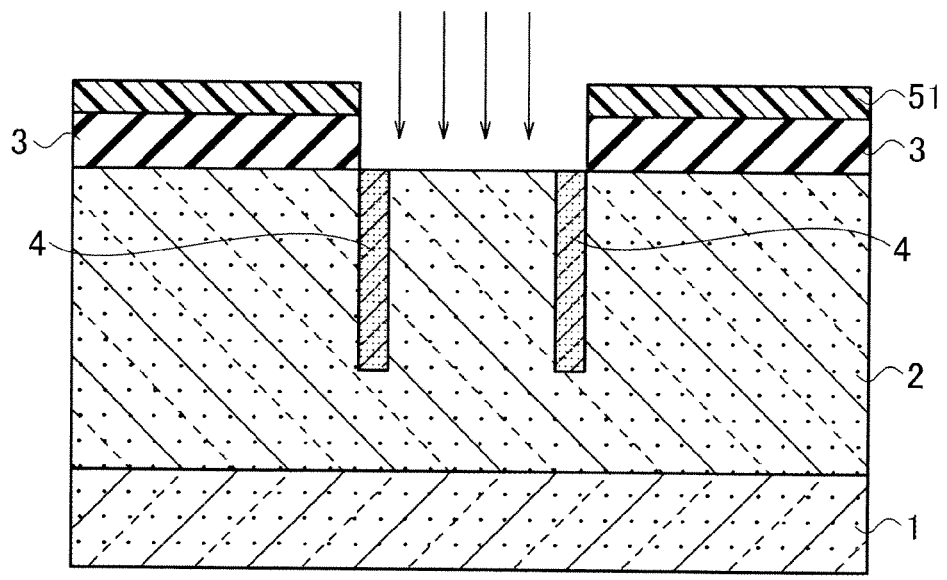
FIG. 6 is a cross-sectional view for explaining a manufacturing step performed after FIG. 5 in the method for manufacturing the semiconductor device in the first embodiment.

After the electric field reducing region 4 is formed, there is formed on the etching mask 3 a photoresist film patterned such that the etching mask 3 above the region where the trench is to be formed is exposed. Specifically, the etching mask 3 above the electric field reducing region 4 and the region of the drift region 2 surrounded by the electric field reducing region 4 is exposed. Then, as shown in FIG. 6, the etching mask 3 is removed by etching by using the photoresist film 51 as an etching mask to expose the top surfaces of the electric field reducing region 4 and the drift region 2 in a region where the trench is to be formed. In other words, an opening portion through which a surface of the electric field reducing region 4 and a surface of the portion of the drift region 2 surrounded by the electric field reducing region 4 are exposed is formed in the etching mask 3.

Figure 7:
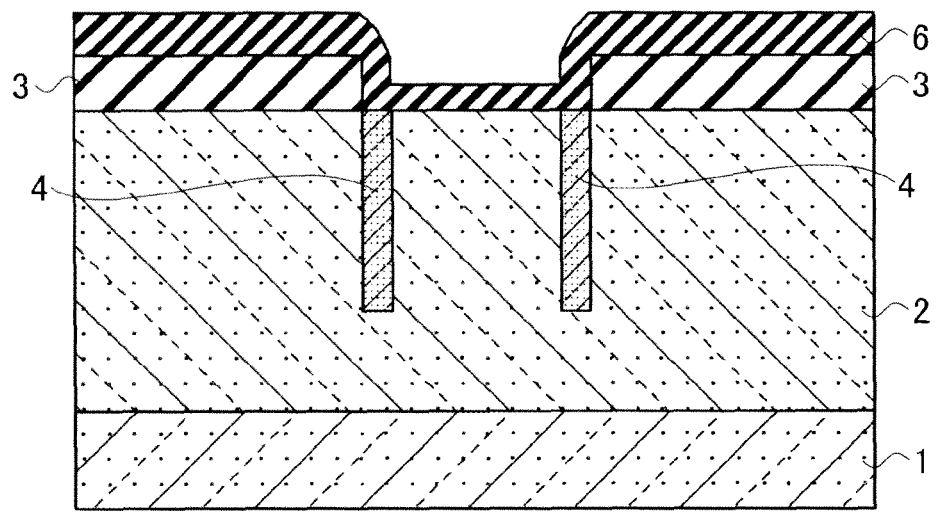
FIG. 7 is a cross-sectional view for explaining a manufacturing step performed after FIG. 6 in the method for manufacturing the semiconductor device in the first embodiment.
Figure 8:
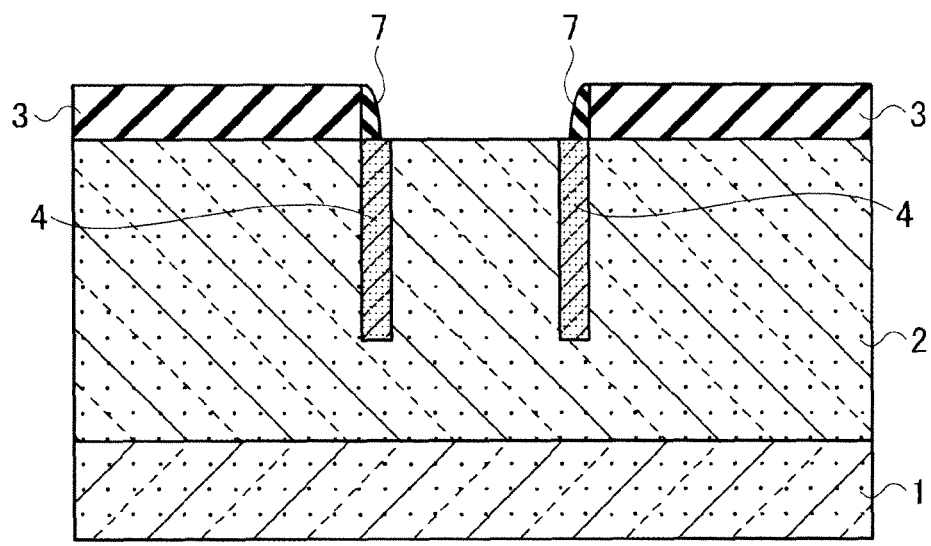
FIG. 8 is a cross-sectional view for explaining a manufacturing step performed after FIG. 7 in the method for manufacturing the semiconductor device in the first embodiment.

Next, as shown in FIG. 7, an oxide film 6 for forming side walls in the side surfaces of the trench is formed on the etching mask 3, the drill region 2, and the electric field reducing region 4. Then, the oxide film 6 is dry-etched. As shown in FIG. 8, part of the oxide film 6 is thus lent in a periphery of the opening portion of the etching mask 3 through which the region where the trench is to be formed is exposed, and the side walls 7 are thereby formed. In this case, the side walls 7 are formed such that ends (inner peripheral edges) thereof are located above the electric field reducing region 4 along the opening portion of the etching mask 3. In other words, the end of the opening portion of the mask for forming the trench is located on the electric field reducing region 4.

Figure 9:
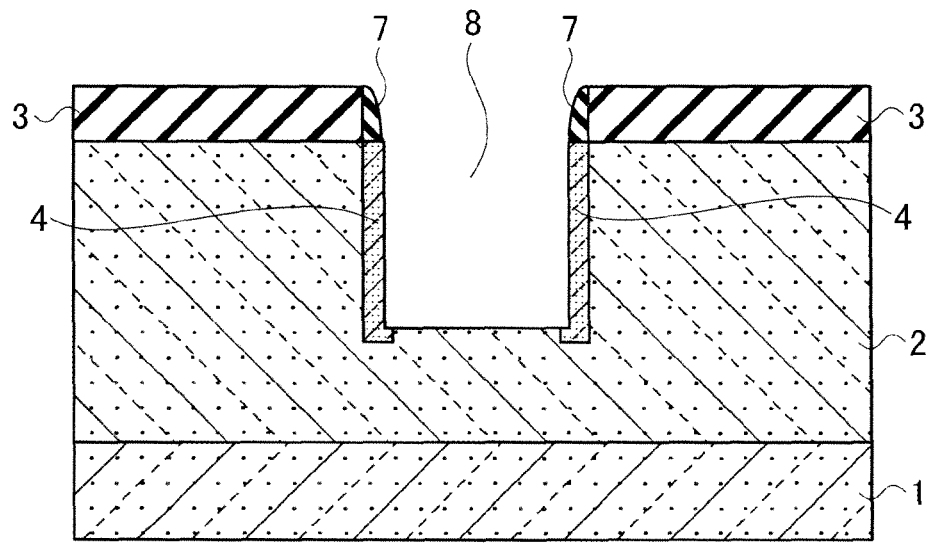
FIG. 9 is a cross-sectional view for explaining a manufacturing step performed after FIG. 8 in the method for manufacturing the semiconductor device in the first embodiment.

Thereafter, as shown in FIG. 9, the trench 8 is formed in part of the upper portion of the drift region 2 by etching using the etching mask 3 and the side walls 7 as a mask. Specifically, the portion of the drift region 2 surrounded by the electric field reducing region 4 and an inner portion of the electric field reducing region 4 are removed by etching and the trench 8 whose side surfaces are covered with the electric field reducing region 4 is formed in the part of the upper portion of the drift region 2. Parts of the electric field reducing region 4 exposed on the side surfaces of the trench 8 are thus etched. Note that, as shown in FIG. 9, the trench 8 is formed such that the bottom portion of the trench 8 is not located below the bottom surface of the electric field reducing region 4. After the trench 8 is formed, the etching mask 3 and the side walls 7 are removed.

Figure 10:
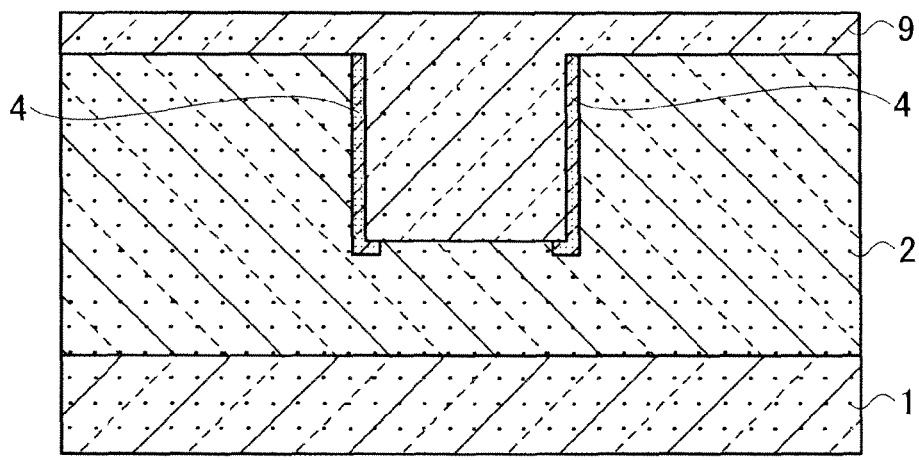
FIG. 10 is a cross-sectional view for explaining a manufacturing step performed after FIG. 9 in the method for manufacturing the semiconductor device in the first embodiment.
Figure 11:
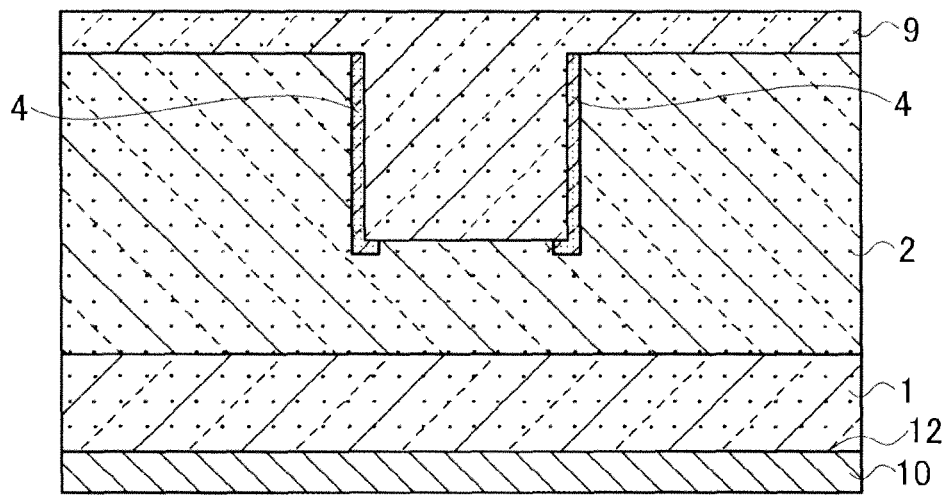
FIG. 11 is a cross-sectional view for explaining a manufacturing step performed after FIG. 10 in the method for manufacturing the semiconductor device in the first embodiment.

Then, as shown in FIG. 10, the anode electrode 9 is formed on the drift region 2 such that the entire trench 8 is filled with the anode electrode 9. Furthermore, as shown in FIG. 11, the cathode electrode 10 is formed on the second main surface 12 of the semiconductor substrate 1. The semiconductor device 100 shown in FIG. 1 is thus completed.

As described above, in the semiconductor device 100 shown in FIG. 1, ions are implanted only into a portion along the side walls of the trench 8. The electric field reducing region 4 formed by this ion implantation reduces the electric field concentrating in the corner portions of the bottom portion of the trench 8. Generation of a leakage current in the off state is thereby suppressed.

Meanwhile, no electric field reducing region 4 is formed in the bottom portion of the trench 8 except for the corner portions. Accordingly, in the on state, a current flows from the anode electrode 9 to the cathode electrode 10 through regions of the bottom portion of the trench 8 other than the corner portions, i.e. the center portion between the corner portions. As a result, it is possible to suppress decrease of the forward current in the semiconductor device 100 while improving the reverse withstand voltage by forming the electric field reducing region 4.

Moreover, since the electric field reducing region 4 is arranged to cover the side surfaces of the trench 8, semiconductor regions are arranged in the order of a second conductivity type (N type) region, a first conductivity type (P type) region, and a second conductivity type (N type) region in the bottom portion of the trench 8. In other words, the bottom portion of the trench 8 has a junction barrier diode structure. The entire bottom portion of the trench 8 can thus have an electric field reducing effect.

Note that in the aforementioned method for manufacturing the semiconductor device 100, the trench 8 surrounded by the electric field reducing region 4 is formed in a self aligned way after the formation of the electric field reducing region 4 in the drift region 2. Accordingly, there is no misalignment between the corner portions of the bottom portion of the trench 8 and the electric field reducing region 4 which may occur in formation using a mask.

Moreover, the side walls 7 are formed such that the ends (inner peripheral edges) thereof are located in the surface of the electric field reducing region 4. Accordingly, the electric field reducing region 4 can be left on the wall surfaces of the trench 8 by performing etching using the etching mask 3 and the side walls 7 as a mask. In other words, the electric field reducing region 4 can be surely exposed on the side surfaces of the trench 8.

Next, description is given of a modified example of the method for manufacturing the semiconductor device 100 with reference to FIGS. 12 to 16. In the following manufacturing method, there is formed a trench in which the electric field reducing region 4 in the side surfaces is removed by sacrificial oxidation and etching. In other words, the electric field reducing region 4 is formed only in the corner portions of the bottom portion of the trench 8.

Figure 12:
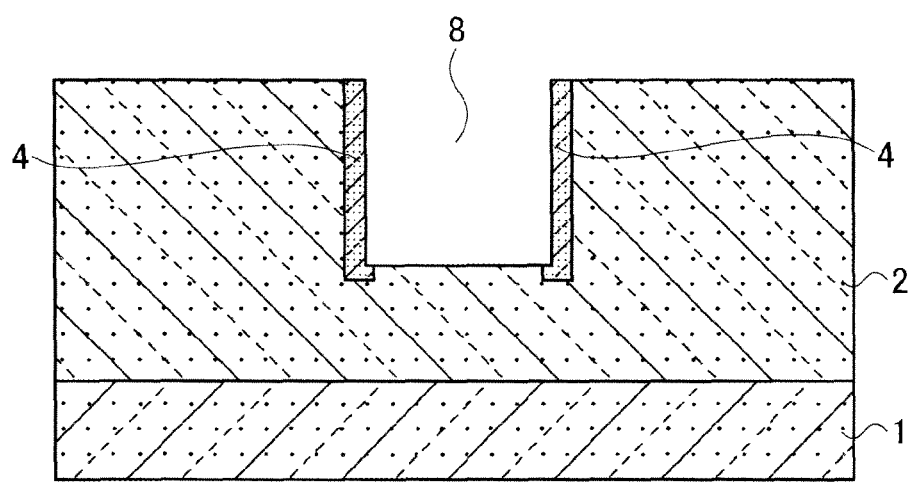
FIG. 12 is a cross-sectional view which shows a manufacturing step and which is used to explain a method for manufacturing a semiconductor device in a modified example of the first embodiment.

As shown in FIG. 12, the trench 8 whose side surfaces are covered with the electric field reducing region 4 is formed in part of the upper portion of the drift region 2 formed on the semiconductor substrate 1, in the same way as that described with reference to FIGS. 4 to 9.

Figure 13:
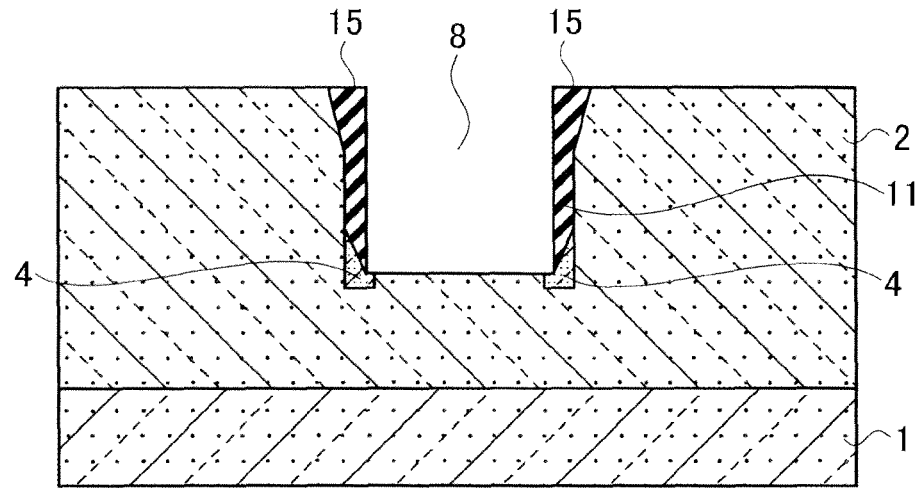
FIG. 13 is a cross-sectional view for explaining a manufacturing step performed after FIG. 12 in the method for manufacturing the semiconductor device in the modified example of the first embodiment.

Thereafter, as shown in FIG. 13, a sacrificial oxide film 15 is formed on inner surfaces of the trench 8. In this case, parts of the electric field reducing region 4 exposed on the side surfaces of the trench 8 are oxidized.

The sacrificial oxide film 15 is formed by, for example, thermally oxidizing the inside of the trench 8 at 900° C. to 1300° C. In this case, the oxidation rate at the side surfaces of the trench 8 is greater than the oxidation rate at the bottom surface of the trench 8. Hence, it is possible to form the sacrificial oxide film 15 on the side surfaces of the trench 8 by thermal oxidation with the unoxidized electric field reducing region 4 being left in the corner portions of the bottom portion of the trench 8.

Figure 14:
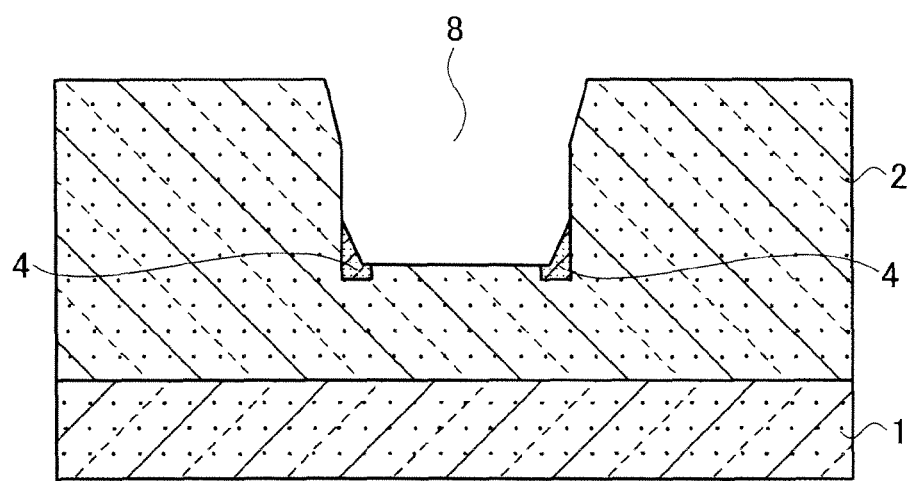
FIG. 14 is a cross-sectional view for explaining a manufacturing step performed after FIG. 13 in the method for manufacturing the semiconductor device in the modified example of the first embodiment.

Next, as shown in FIG. 14, the sacrificial oxide film 15 is removed by etching. For example, the sacrificial oxide film 15 on the side surfaces of the trench 8 is removed by etching using hydrofluoric acid.

Figure 15:
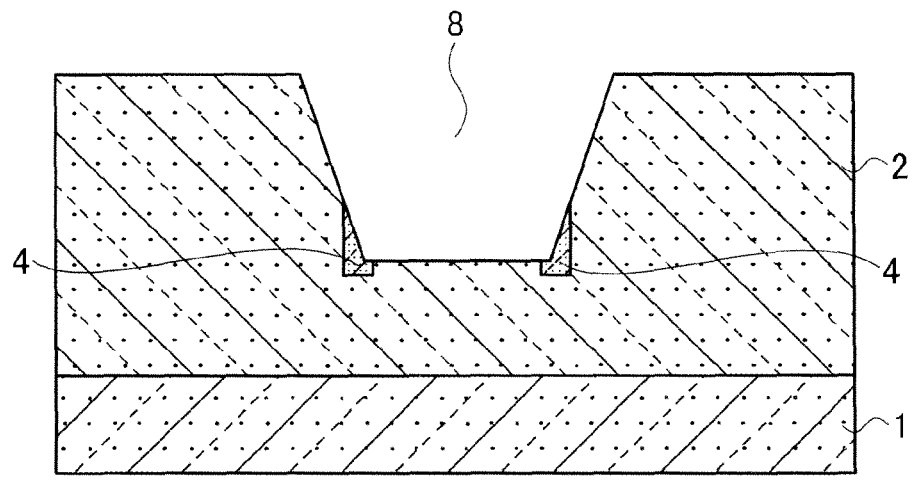
FIG. 15 is a cross-sectional view for explaining a manufacturing step performed after FIG. 14 in the method for manufacturing the semiconductor device in the modified example of the first embodiment.
Figure 16:
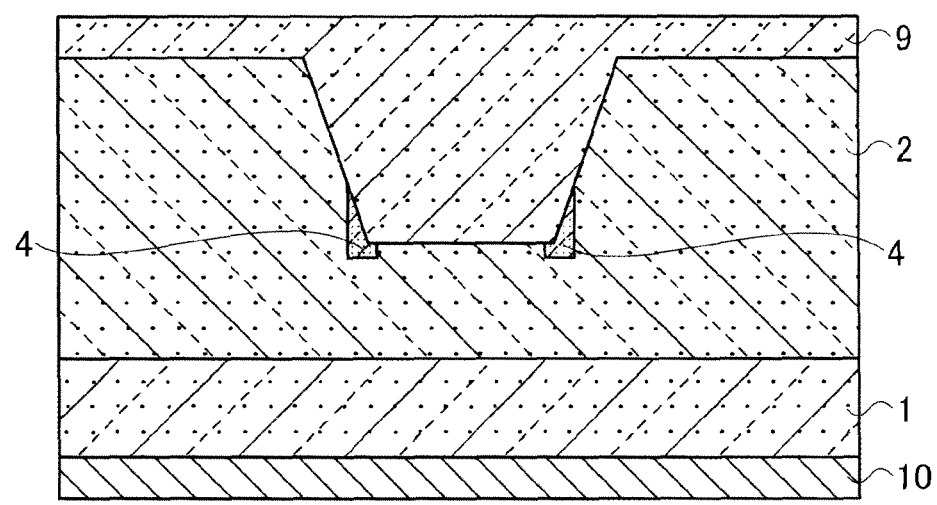
FIG. 16 is a cross-sectional view for explaining a manufacturing step performed after FIG. 15 in the method for manufacturing the semiconductor device in the modified example of the first embodiment.

By repeating the aforementioned formation of the sacrificial oxide film 15 and removal thereof by etching, the trench 8 is formed such that the side surfaces of the trench 8 are tapered toward the bottom surface as shown in FIG. 15. Then, the electric field reducing region 4 is left only in the corner portions of the bottom portion of the trench 8. Thereafter, as shown in FIG. 16, the semiconductor device 100 is completed by forming the anode electrode 9 and the cathode electrode 10.

Electrical connection between the anode electrode 9 and the drift region 2 can be obtained also in the side surfaces of the trench 8 by forming no electric field reducing region 4 in the side surfaces of the trench 8. In other words, in the on state, a current flows from the anode electrode 9 to the cathode electrode 10 through the side surfaces of the trench 8.

Alternatively, the trench may be formed by performing etching such that the side surfaces of the trench 8 are tapered toward the bottom surface to allow removal of the electric field reducing region 4 in contact with the side surfaces of the trench 8. For example, the shape shown in FIG. 15 can be obtained as follows. After the electric field reducing region 4 is formed, the upper portion of the drift region 2 is partially removed by etching under a condition in which the side surfaces of the trench 8 are formed to be tapered. Thereafter, as in FIG. 16, the anode electrode 9 is formed to cover the trench 8 and the cathode electrode 10 is formed on the second main surface 12 of the semiconductor substrate 1. Also in this manufacturing method, the trench 8 is formed into a tapered shape and the electric field reducing region 4 is arranged only in the corner portions of the bottom portion of the trench 8.

Second Embodiment

A method for manufacturing a semiconductor device 100 in a second embodiment of the present invention is described with reference to FIGS. 17 to 20.

Figure 17:
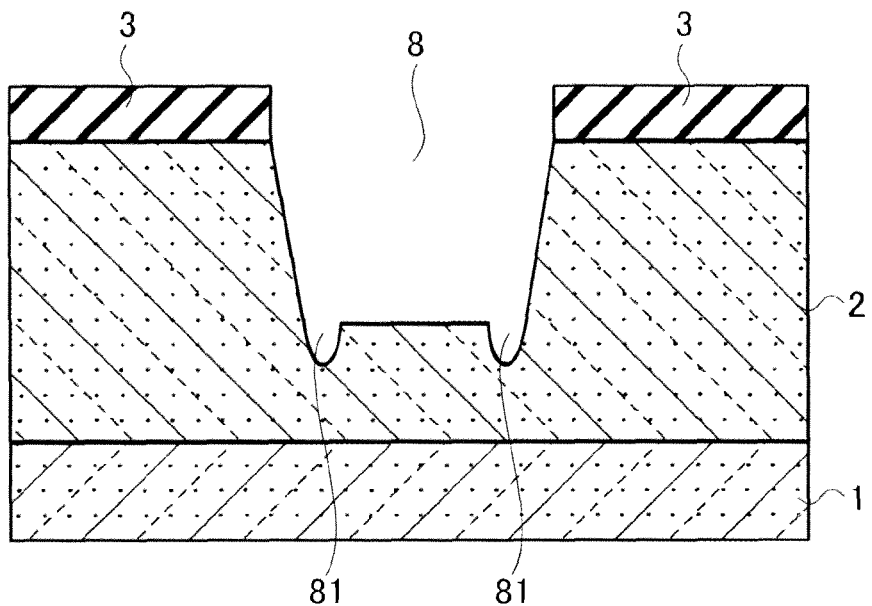
FIG. 17 is a cross-sectional view which shows a manufacturing step and which is used to explain a method for manufacturing a semiconductor device in a second embodiment.

First, as shown in FIG. 4, a drift region 2 with low impurity concentration is formed on a semiconductor substrate 1 with high impurity concentration. Then, as shown in FIG. 17, there is formed an etching mask 3 in which a top surface of the drift region 2 is exposed in a region where a trench 8 is to be formed. The trench 8 is formed in the drift region 2 under a condition in which small trenches called micro-trenches are formed by etching by using the etching mask 3 as a mask. In this etching, for example, oxygen ($O_2$) gas and sulfur hexafluoride ($SF_6$) are used as etching gas. The etching condition is such that an antenna output is 300 to 500 W and a bias output is 50 to 100 W. By dry-etching a SiC wafer under such a condition, the trench 8 having micro-trenches 81 in corner portions of a bottom portion is formed as shown in FIG. 17. In this case, the trench 8 is formed such that side surfaces are tapered toward a bottom surface. Note that the micro trenches are depressions (or cavities) formed in boundary portions between the side surfaces and the bottom surface of the trench 8 by etching.

Figure 18:
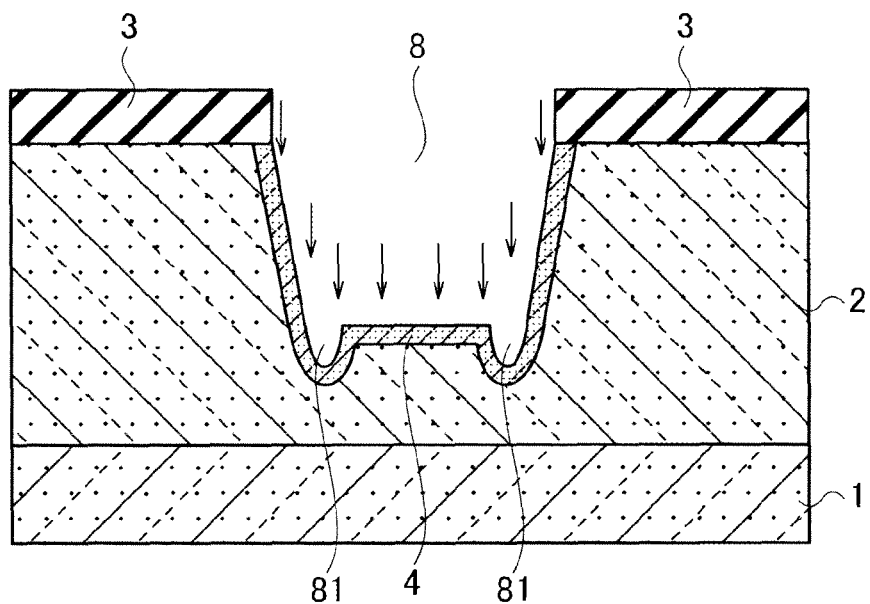
FIG. 18 is a cross-sectional view for explaining a manufacturing step performed after FIG. 17 in the method for manufacturing the semiconductor device in the second embodiment.

Next, as shown in FIG. 18, impurity ions are implanted into the entire trench 8. An electric field reducing region 4 is thereby formed in the bottom portion and the side surfaces of the trench 8 and in the corner portions of the bottom portion where the micro trenches 81 are formed.

Figure 19:
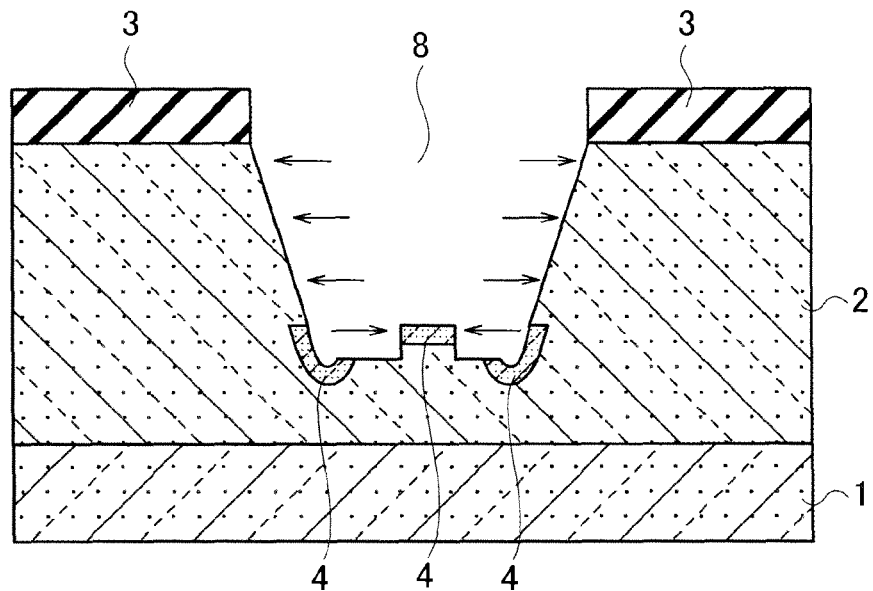
FIG. 19 is a cross-sectional view for explaining a manufacturing step performed after FIG. 18 in the method for manufacturing the semiconductor device in the second embodiment.
Figure 20:
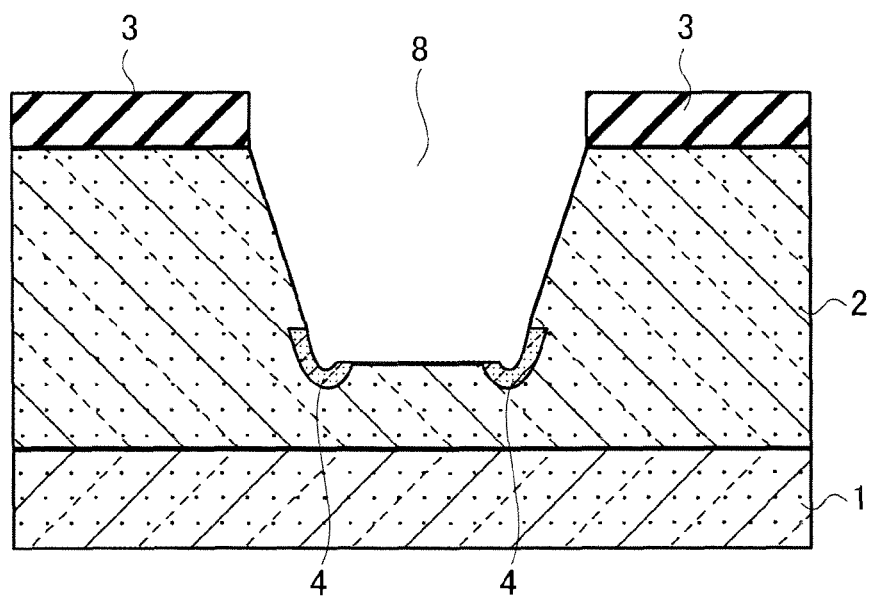
FIG. 20 is a cross-sectional view for explaining a manufacturing step performed after FIG. 19 in the method for manufacturing the semiconductor device in the second embodiment.

Then, as shown in FIG. 19, etching in a lateral direction is performed inside the trench 8. For example, inner surfaces of the trench 8 are etched by the method described with reference to FIGS. 13 to 15 in which the sacrificial oxidation and the removal of the sacrificial oxide film is repeated or by thermal etching in a chlorine atmosphere. FIG. 20 shows a state where the etching in a lateral direction is completed. As shown in FIG. 20, a center portion of the bottom portion of the trench 8 is also removed by etching, and the electric field reducing region 4 is left only around the regions where the micro-trenches 81 are formed. In other words, a state where the electric field reducing region 4 is arranged only in the corner portions of the bottom portion of the trench 8 is obtained.

Thereafter, an anode electrode 9 is formed to be embedded in the trench 8. Then, a cathode electrode 10 is formed on a second main surface of the semiconductor substrate 1, and the semiconductor device 100 is thus completed.

The electric field reducing region 4 is formed only in the corner portions of the bottom portion of the trench 8 also in the aforementioned method for manufacturing the semiconductor device 100 in the second embodiment. As a result, it is possible to suppress decrease of the forward current in the semiconductor device 100 while improving the reverse withstand voltage.

Moreover, in the method for manufacturing the semiconductor device 100 in the second embodiment, after the trench 8 is formed under the condition in which the micro-trenches 81 are formed, the electric field reducing region 4 is formed by ion implantation. Then, the electric field reducing region 4 is left only in the corner portions of the bottom portion of the trench 8 by performing etching inside the trench 8. Using the manufacturing method described above can reduce the ion implantation energy required to form the electric field reducing region 4 compared to a case where ions are implanted from the surface of the drift region 2. Moreover, the steps can be reduced compared to the first embodiment.

Furthermore, ions may be implanted in directions oblique to the surface of the drift region 2 to form the electric field reducing region 4 only in the corner portions of the bottom portion of the trench 8. This method is described below with reference to FIGS. 21 and 22.

Figure 21:
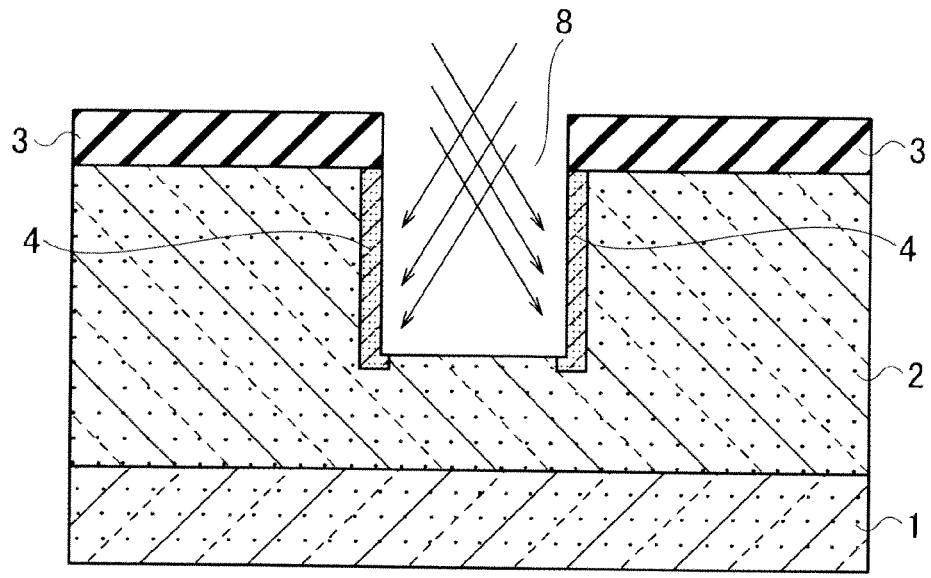
FIG. 21 is a cross-sectional view which shows a manufacturing step and which is used to explain a method for manufacturing a semiconductor device in a modified example of the second embodiment.

First, the drift region 2 is formed on a first main surface 11 of the semiconductor substrate 1, and then the trench 8 is formed in part of an upper portion of the drift region 2 by dry etching. Next, as shown in FIG. 21, impurity ions are implanted into the trench 8 in directions oblique to the surface of the drift region 2. The electric field reducing region 4 is thereby formed on the side surface of the trench 8. In this case, an angle of ion implantation with respect to the surface of the drift region 2 is set such that the impurity ions are implanted into the corner portions of the bottom portion of the trench 8 but are not implanted into the bottom portion other than the corner portions.

Figure 22:
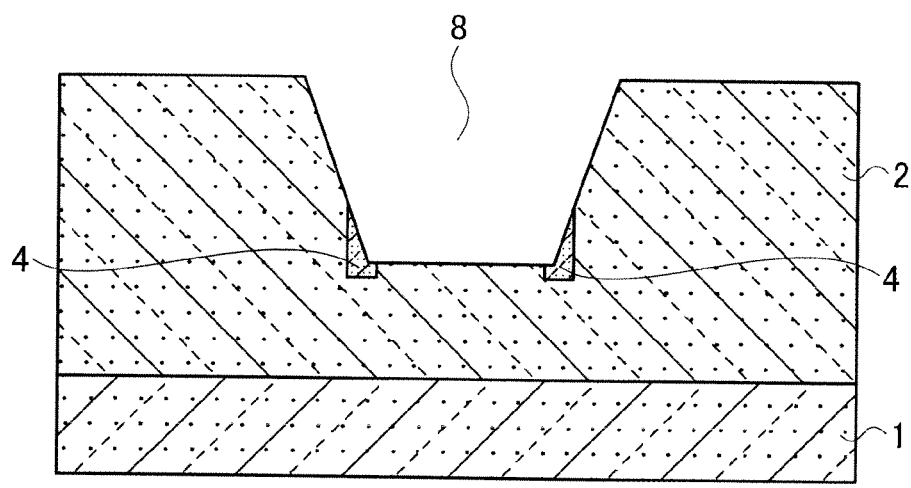
FIG. 22 is a cross-sectional view for explaining a manufacturing step performed after FIG. 21 in the method for manufacturing the semiconductor device in the modified example of the second embodiment.

Next, the electric field reducing region 4 formed in the side surfaces of the trench 8 are removed by etching by using, for example, the method described with reference to FIGS. 13 to 15 in which the sacrificial oxidation and the removal of the sacrificial oxide film is repeated. As a result, as shown in FIG. 22, a state where the electric field reducing region 4 is arranged only in the corner portions of the bottom portion of the trench 8 is obtained. Thereafter, the anode electrode 9 and the cathode electrode 10 are formed, and the semiconductor device 100 is thus completed.

In the manufacturing method described above, after the trench 8 is formed, the electric field reducing region 4 is formed in exposed regions inside the trench 8 except for the bottom portion of the trench 8 not including the corner portions, by implanting the ions in the directions oblique to the side surfaces of the trench 8. Accordingly, the electric field reducing region 4 can be formed in the corner portions and the side surfaces of the trench 8 in few steps.

Third Embodiment

A method for manufacturing a semiconductor device 100 in a third embodiment of the present invention is described with reference to FIGS. 23 to 29.

First, a drift region 2 with low impurity concentration is formed on a semiconductor substrate 1 with high impurity concentration. Furthermore, an anode electrode layer 90 is formed on the drift region 2.

Figure 23:
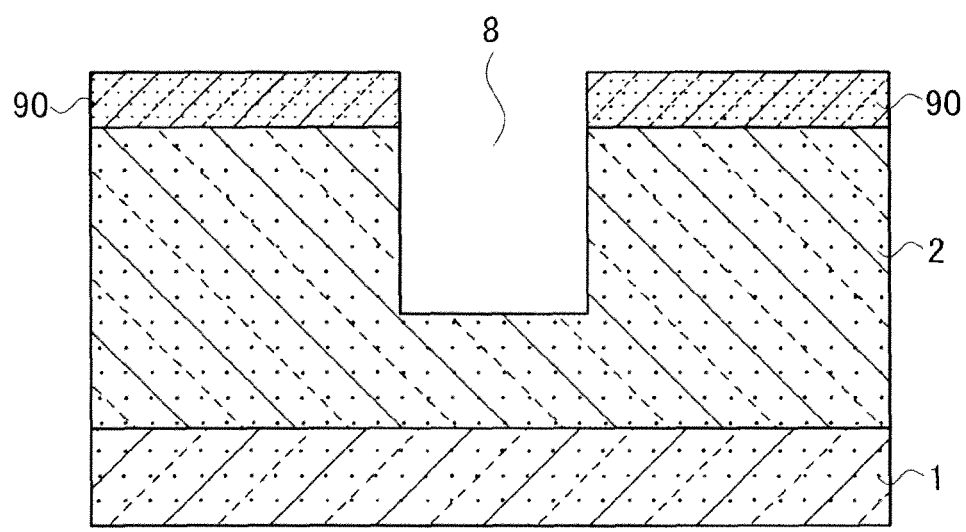
FIG. 23 is a cross-sectional view which shows a manufacturing step and which is used to explain a method for manufacturing a semiconductor device in a third embodiment.

Then, as shown in FIG. 23, a trench 8 penetrating the anode electrode layer 90 and reaching an inner portion of the drift region 2 is formed by dry etching using an etching mask (not illustrated).

Figure 24:
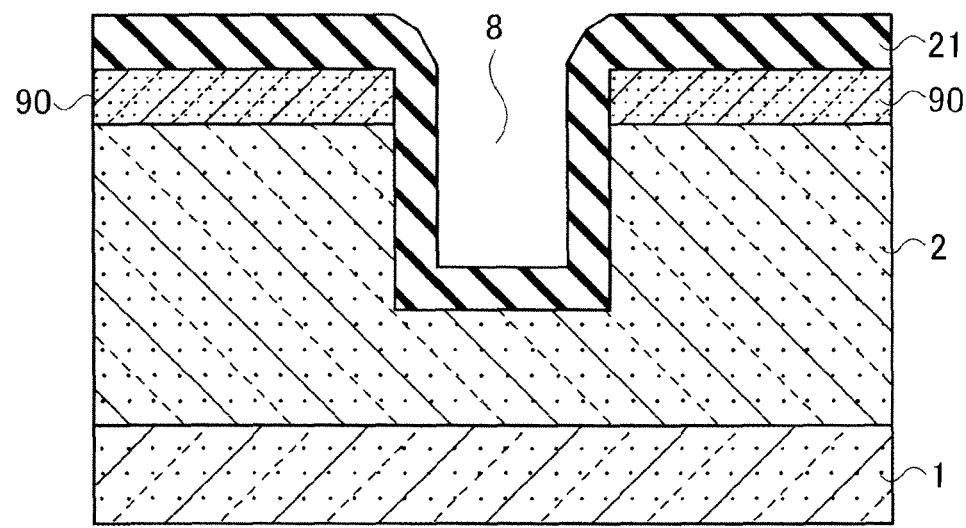
FIG. 24 is a cross-sectional view for explaining a manufacturing step performed after FIG. 23 in the method for manufacturing the semiconductor device in the third embodiment.
Figure 25:
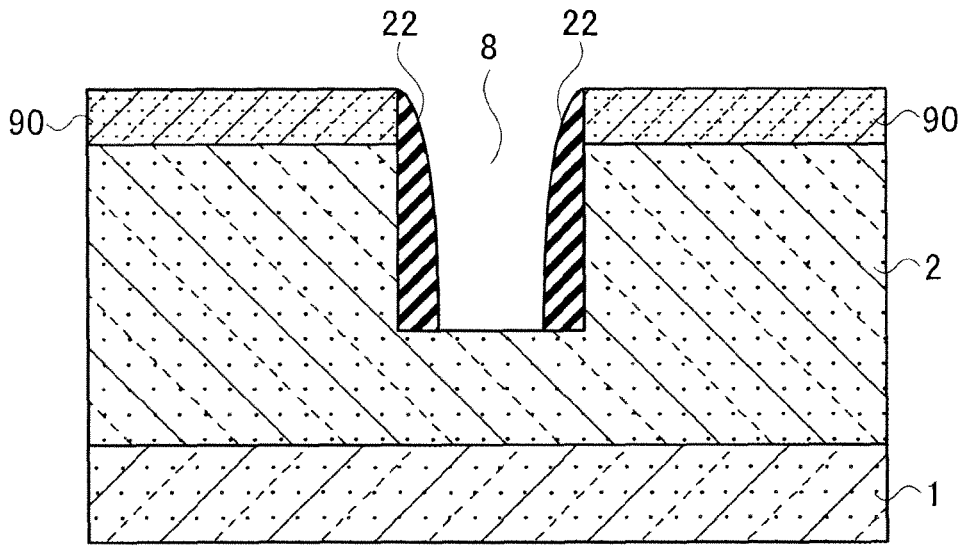
FIG. 25 is a cross-sectional view for explaining a manufacturing step performed after FIG. 24 in the method for manufacturing the semiconductor device in the third embodiment.

Thereafter, as shown in FIG. 24, a side wall formation film 21 for forming side walls to be described later is formed on inner surfaces of the trench 8 and a top surface of the drift region 2 such that at least the trench 8 is completely covered. For example, an oxide film such as a silicon oxide ($SiO_2$) film is employed as the side wall formation film 21. Next, the side wall formation film 21 is etched by dry etching and side walls 22 are formed on side surfaces of the trench 8 as shown in FIG. 25. In this case, a center portion of a bottom portion of the trench 8 is exposed.

Figure 26:
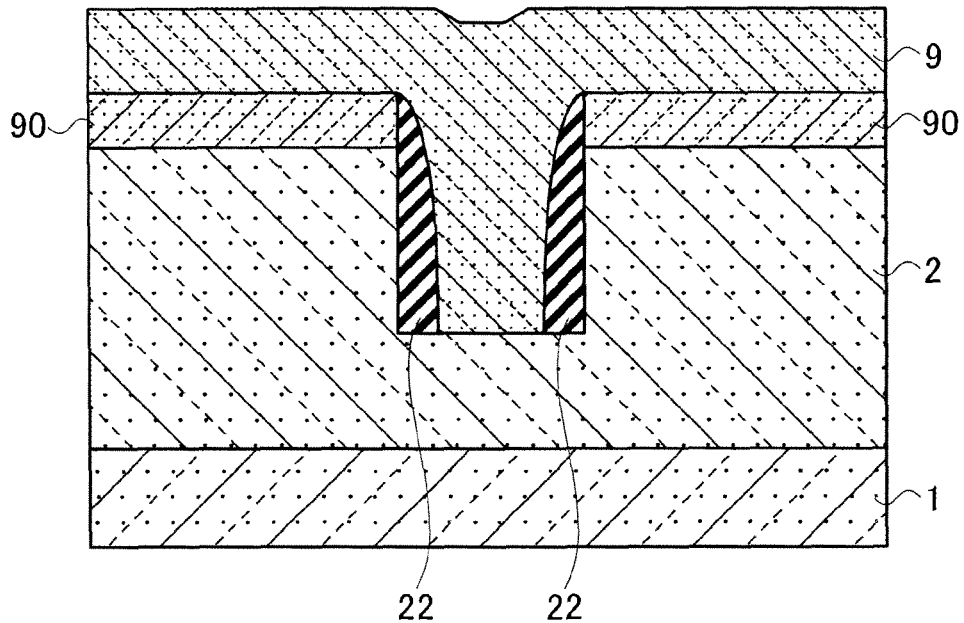
FIG. 26 is a cross-sectional view for explaining a manufacturing step performed after FIG. 25 in the method for manufacturing the semiconductor device in the third embodiment.
Figure 27:
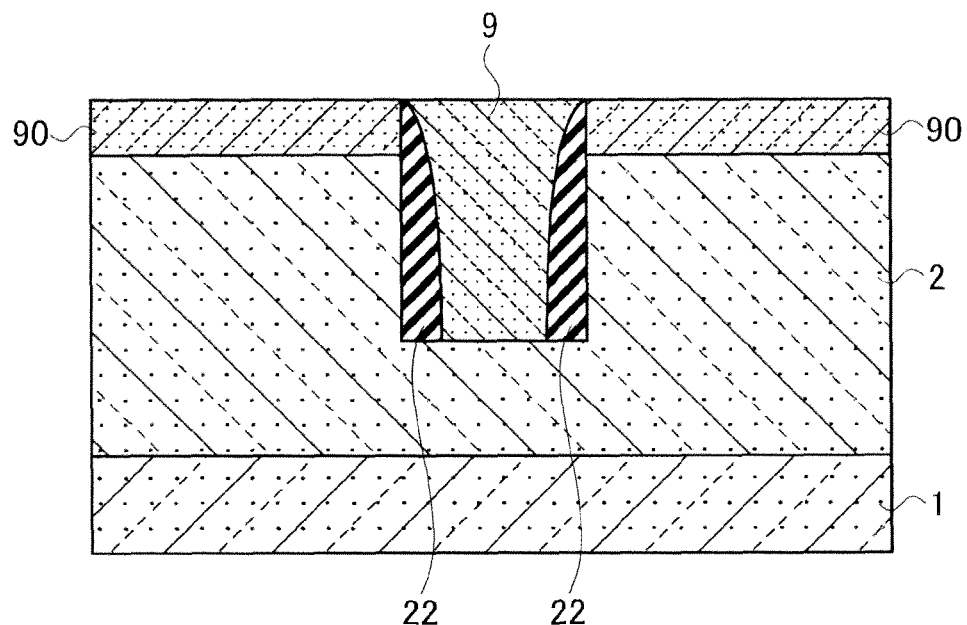
FIG. 27 is a cross-sectional view for explaining a manufacturing step performed after FIG. 26 in the method for manufacturing the semiconductor device in the third embodiment.

Next, as shown in FIG. 26, an anode electrode 9 is formed to be embedded into the trench 8 whose side surfaces are covered with the side walls 22. Then, as shown in FIG. 27, an upper portion of the anode electrode 9 is etched back until top surfaces of the side walls 22 are exposed.

Figure 28:
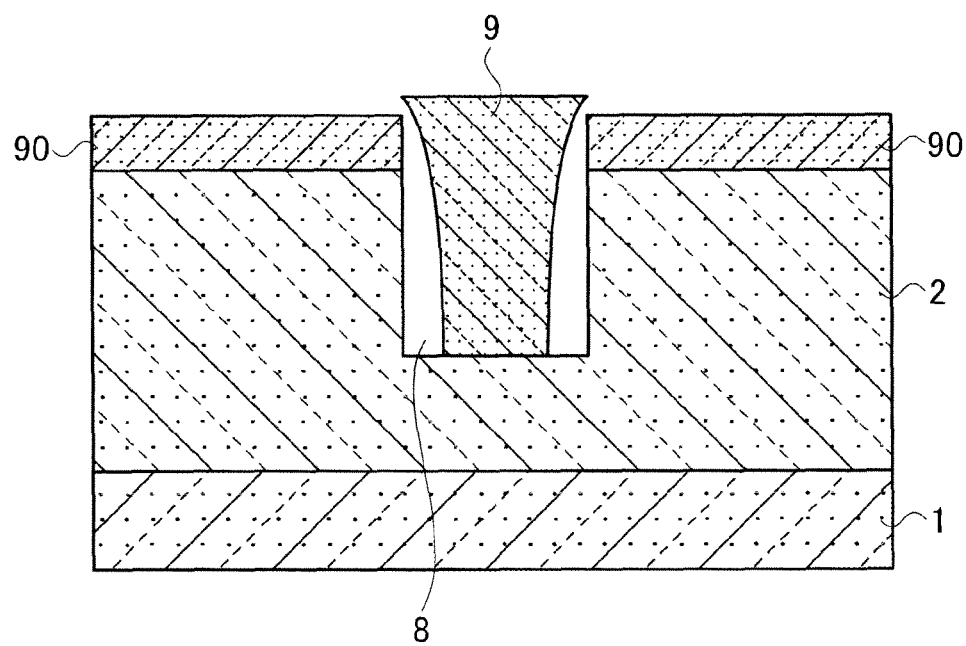
FIG. 28 is a cross-sectional view for explaining a manufacturing step performed after FIG. 27 in the method for manufacturing the semiconductor device in the third embodiment.
Figure 29:
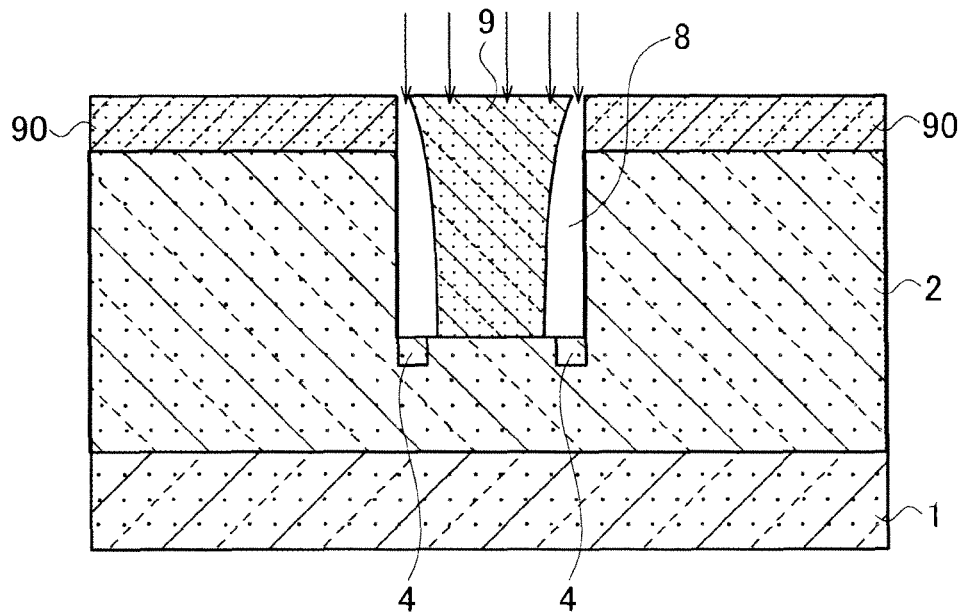
FIG. 29 is a cross-sectional view for explaining a manufacturing step performed after FIG. 28 in the method for manufacturing the semiconductor device in the third embodiment.

Thereafter, the side walls 22 are removed by etching. A gap is thereby formed between the anode electrode 9 and the side surfaces of the trench 8 as shown in FIG. 28. Then, as shown in FIG. 29, ions are implanted through the gap between the anode electrode 9 and the side surfaces of the trench 8 from above the trench 8, and the impurity ions having passed by a side surface of the anode electrode 9 are thereby implanted into corner portions of the bottom portion of the trench 8. In this case, a mask material (not illustrated) is arranged on regions of the anode electrode layer 90 where the trench 8 is not formed, and the impurity ions are implanted into regions where the mask material is not arranged. An electric field reducing region 4 is thus formed only in the corner portions of the bottom portion of the trench 8. The anode electrode 9 is doped with the impurity ions simultaneously with the formation of the electric field reducing region 4.

Then, a cathode electrode 10 is formed on a second main surface 12 of the semiconductor substrate 1, and the semiconductor device 100 is thus completed. An anode of the semiconductor device 100 is formed of the anode electrode layer 90 and the anode electrode 9.

In the method for manufacturing the semiconductor device 100 in the third embodiment, the side walls 22 are formed on the side surfaces of the trench 8, and then the anode electrode 9 is formed in the trench 8 by growing, for example, a polysilicon film. Then, etch back is performed to leave only a portion of the polysilicon film embedded in the trench 8. This allows the side walls 22 formed on the side surfaces of the trench 8 to be removed. The corner portions of the bottom portion of the trench 8 are exposed by removing the side walls 22 and the impurity ions are selectively implanted around the corner portions.

In the method for manufacturing the semiconductor device 100 in the third embodiment, the electric field reducing region 4 and a conductive polysilicon electrode which serves as the anode electrode 9 can be formed in few steps.

Fourth Embodiment

A method for manufacturing a semiconductor device 100 in a fourth embodiment of the present invention is described with reference to FIGS. 30 to 34. The method for manufacturing the semiconductor device 100 in the fourth embodiment is a method for manufacturing a heterojunction diode (HJD) made of SiC. As described below, a P type silicon film forming a relatively-high energy barrier at an interface with SiC is embedded inside a trench, and a N type polysilicon film forming a relatively-low energy barrier at an interface with SiC is formed on a drift region 2 except for a region where the trench is formed.

Figure 30:
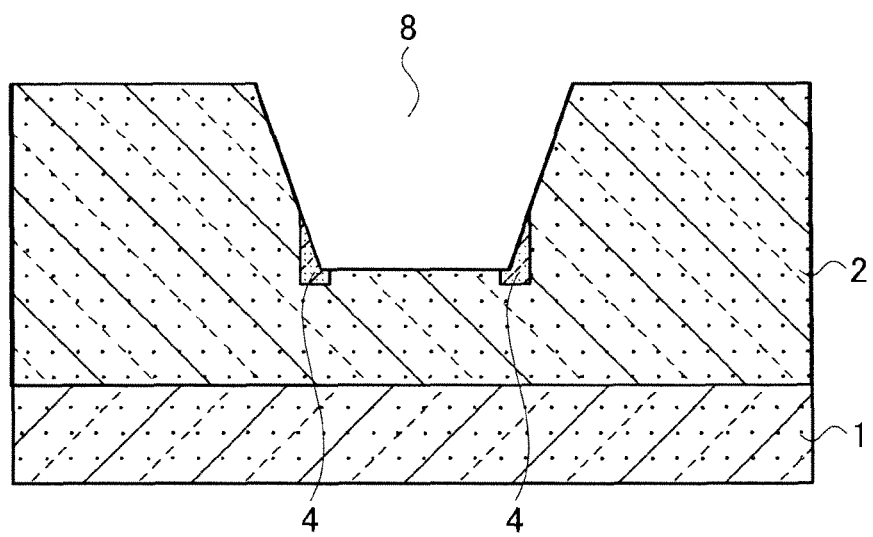
FIG. 30 is a cross-sectional view which shows a manufacturing step and which is used to explain a method for manufacturing a semiconductor device in a fourth embodiment.

First, the drift region 2 is formed on a first main surface 11 of a semiconductor substrate 1, and then the trench is formed in part of an upper portion of the drift region 2 by dry etching. Next, a structure shown in FIG. 30 is obtained by using, for example, the method described with reference to FIGS. 13 to 15 in which the sacrificial oxidation and the removal of the sacrificial oxide film is repeated or a method of forming the trench 8 into a tapered shape. In other words, an electric field reducing region 4 is formed in corner portions of a bottom portion of the trench 8.

Figure 31:
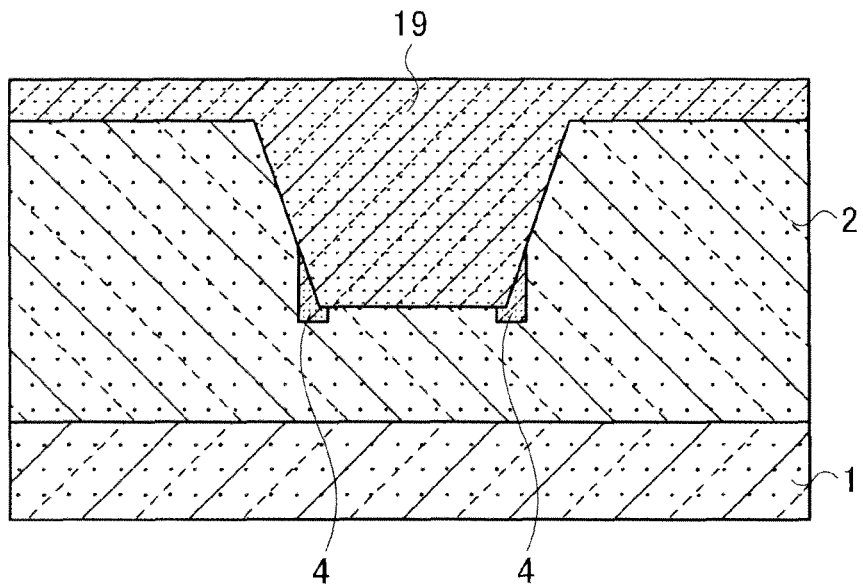
FIG. 31 is a cross-sectional view for explaining a manufacturing step performed after FIG. 30 in the method for manufacturing the semiconductor device in the fourth embodiment.

Next, as shown in FIG. 31, a polysilicon film 19 to be an anode electrode 9 is grown on the drift region 2 to be embedded into the trench 8.

Figure 32:
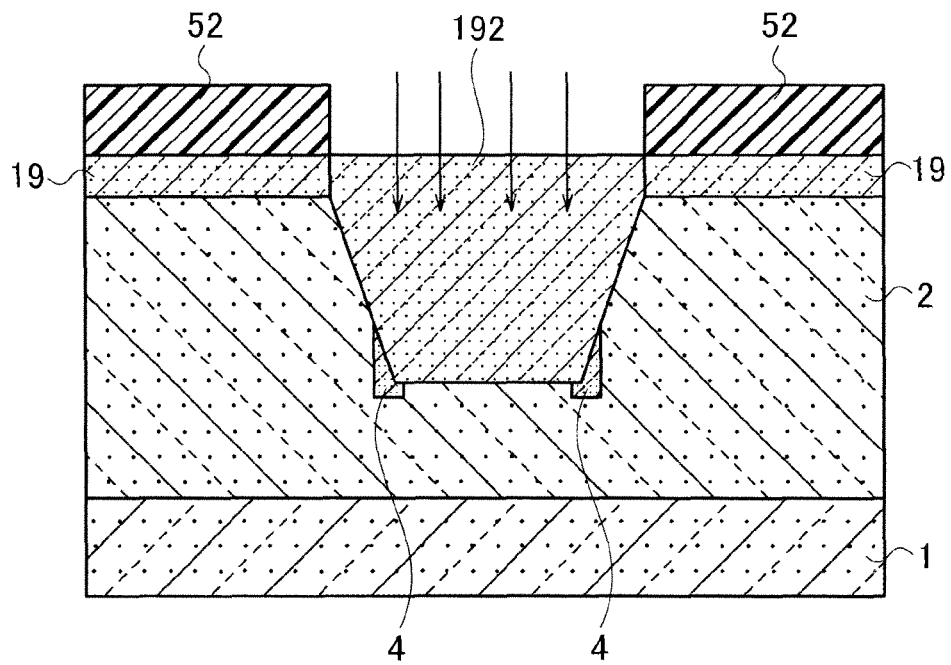
FIG. 32 is a cross-sectional view for explaining a manufacturing step performed after FIG. 31 in the method for manufacturing the semiconductor device in the fourth embodiment.

Then, as shown in FIG. 32, ions are implanted into the polysilicon film 19 by using a photoresist film 52 as a mask, the photoresist film 52 having an opening above the trench 8 which is formed by patterning. Specifically, the polysilicon film 19 is doped with a P type (second conductivity type) impurity which is an acceptor in the anode electrode 9, and a second conductivity type impurity implanted region 192 is thereby formed.

Figure 33:
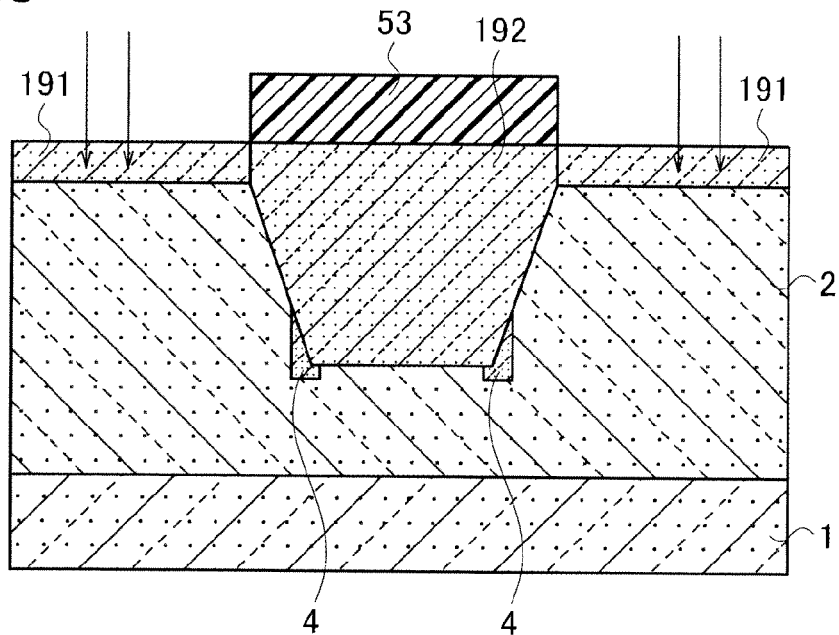
FIG. 33 is a cross-sectional view for explaining a manufacturing step performed after FIG. 32 in the method for manufacturing the semiconductor device in the fourth embodiment.

Furthermore, as shown in FIG. 33, ions are implanted into the polysilicon film 19 by using a photoresist film 53 as a mask, the photoresist film 53 arranged only above the second conductivity type impurity implanted region 192 by pattering. Specifically, the polysilicon film 19 is doped with an N type (first conductivity type) impurity which is a donor in the anode electrode 9, and a first conductivity type impurity implanted region 191 is thereby formed.

Figure 34:
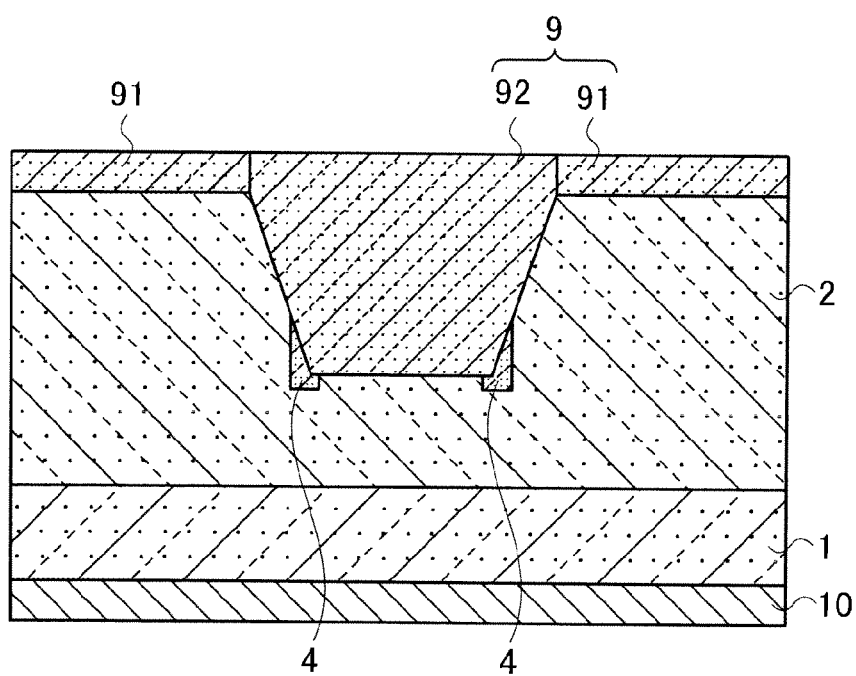
FIG. 34 is a cross-sectional view for explaining a manufacturing step performed after FIG. 33 in the method for manufacturing the semiconductor device in the fourth embodiment.

Thereafter, annealing is performed to activate the impurities in the first conductivity type impurity implanted region 191 and the second conductivity type impurity implanted region 192, and a first conductivity type anode electrode region 91 and a second conductivity type anode electrode region 92 are thereby formed as shown in FIG. 34. Specifically, a region of the anode electrode 9 embedded inside the trench 8 is doped with the second conductivity type impurity, and the second conductivity type anode electrode region 92 is thereby formed. Moreover, the anode electrode 9 formed on the drift region 2 in regions other than a region where the trench 8 is formed is doped with the first conductivity type impurity, and the first conductivity type anode electrode region 91 is thereby formed.

Then, a cathode electrode 10 is formed on a second main surface 12 of the semiconductor substrate 1, and the semiconductor device 100 is thus completed.

Basic operations of the semiconductor device 100 shown in FIG. 34 are described with reference to FIGS. 35 and 36.

Figure 35:
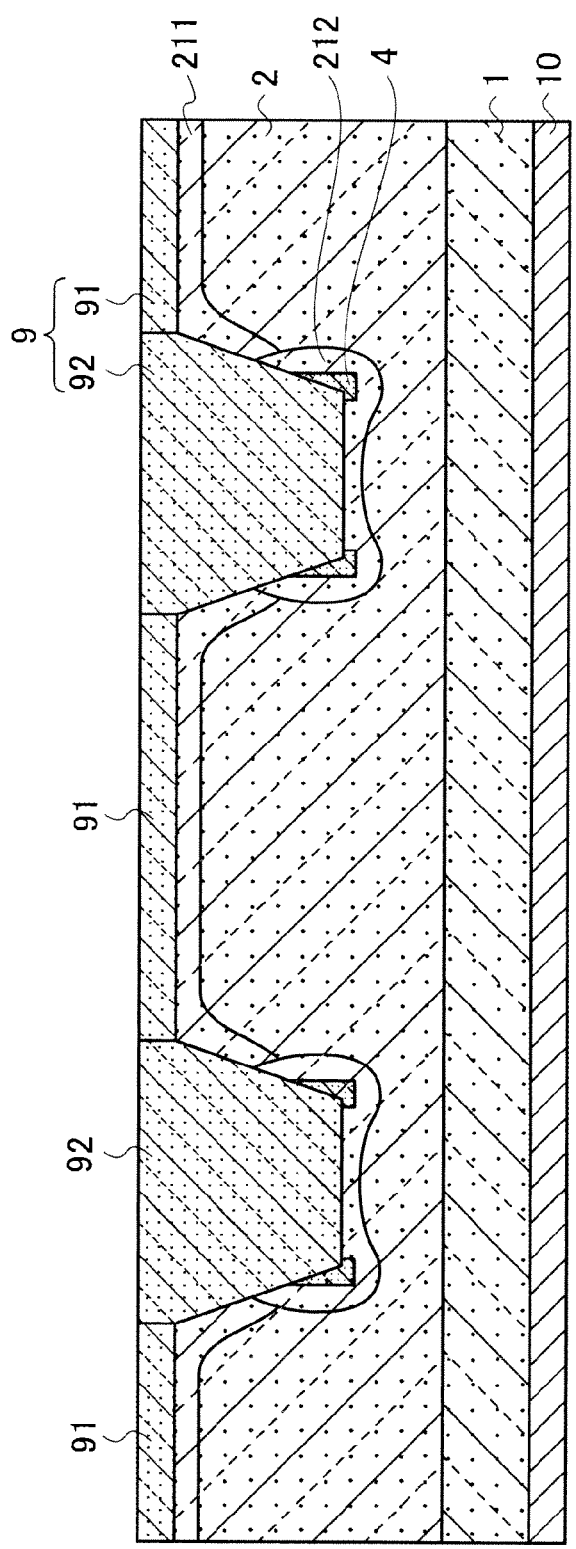
FIG. 35 is a schematic cross-sectional view for explaining an operation of the semiconductor device in the fourth embodiment in an off state.
Figure 36:
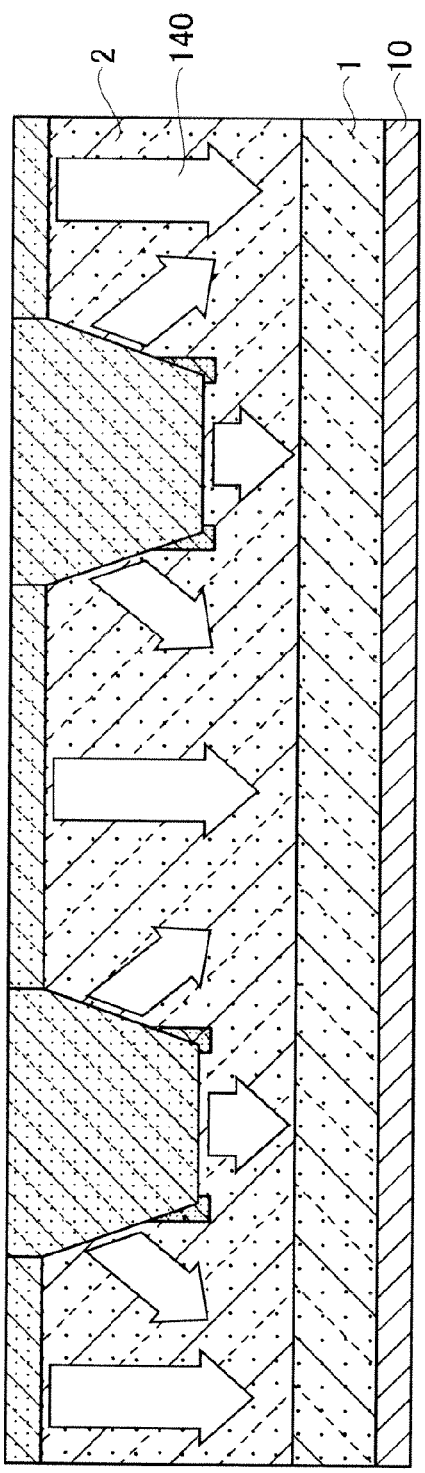
FIG. 36 is a schematic cross-sectional view for explaining an operation of the semiconductor device in the fourth embodiment in an on state.

As shown in FIG. 35, when a positive voltage is applied to the cathode electrode 10 with the anode electrode 9 being a reference, a depletion layer 211 spreads from the second conductivity type anode electrode region 92 to cover an area extending to the first conductivity type anode electrode region 91 where the barrier is low, and the electric field is thereby reduced. Moreover, a depletion layer 212 spreads from the electric field reducing region 4 of the second conductivity type at a trench end to cover the trench end, and the electric field concentrating at the trench end is thereby reduced.

When a negative voltage is applied to the cathode electrode 10 with the anode electrode 9 being the reference, a forward current 130 flows from the anode electrode 9 to the cathode electrode 10. In this case, a large forward current flows from the first conductivity type anode electrode region 91 where the barrier is low. Meanwhile, in the second conductivity type anode electrode region 92, there no electric field reducing region 4 of the second conductivity type in a center portion of a bottom portion of the trench and on side surfaces of the trench. Accordingly, as shown in FIG. 36, a forward current 140 can flow through the center portion of the trench bottom portion and the side surfaces of the trench.

As described above, in the method for manufacturing the semiconductor device 100 in the fourth embodiment, the second conductivity type anode electrode region 92 where the energy barrier is high is arranged inside the trench 8, and the first conductivity type anode electrode region 91 where the energy barrier is low is arranged in a region where no trench is formed. As a result, it is possible to achieve a semiconductor device 100 which allows a large forward current to flow when a voltage is applied in a forward direction and which can suppress a leakage current when a voltage is applied in a reverse direction.

The contents of the present invention have been described above by using the first to fourth embodiments. However, the present invention is not limited to the embodiments described above and it is apparent to those skilled in the art that various modifications and improvements can be made.

The entire contents of Japanese Patent Application No. 2012-231401 (filed Oct. 19, 2012) are incorporated herein by reference.

INDUSTRIAL APPLICABILITY

In the embodiments of the present invention, the electric field reducing region 4 is not formed across the entire trench bottom portion. Accordingly, it is possible to provide a semiconductor device in which decrease of the forward current is suppressed and a method for manufacturing the same. The semiconductor devices and the methods for manufacturing the semiconductor devices in the embodiments are useful in electronic device industries including manufacturing industries manufacturing rectifying semiconductor devices in which trenches are formed.

REFERENCE SIGNS LIST

1 semiconductor substrate
2 drift region
4 electric field reducing region
6 oxide film
7 side wall
8 trench 9 anode electrode
10 cathode electrode
11 first main surface
12 second main surface
15 sacrificial oxide film
19 polysilicon film
22 side wall
81 micro-trench
91 first conductivity type anode electrode region
92 second conductivity type anode electrode region
100 semiconductor device

The invention claimed is:

1. A semiconductor device comprising:
    a semiconductor substrate;
    a drift region of a first conductivity type having a trench in part of an upper portion thereof and arranged on a first main surface of the semiconductor substrate;
    an electric field reducing region of a second conductivity type arranged, in an inner surface of the trench, only around a corner portion and not in a center portion;
    an anode electrode embedded in the trench and connected directly on a top surface of the drift region and a part of a side surface of the trench; and
    a cathode electrode arranged on a second main surface of the semiconductor substrate which is opposite to the first main surface, wherein
    the electric field reducing region does not cover all of the side surface of the trench.

2. A method for manufacturing a semiconductor device, comprising:
    forming a drift region of a first conductivity type on a first main surface of a semiconductor substrate;
    selectively forming an electric field reducing region of a second conductivity type in part of an upper portion of the drift region by ion implantation;
    forming a trench in part of an upper portion of the drift region by etching a portion of the drift region surrounded by the electric field reducing region and an inner portion of the electric field reducing region, the trench having a side surface surrounded by the electric field reducing region;
    forming an anode electrode on the drift region by embedding the anode electrode into the trench; and
    forming a cathode electrode on a second main surface of the semiconductor substrate which is opposite to the first main surface, wherein
    the forming a trench includes:
    forming an etching mask having an opening portion through which a surface of the portion of the drift region surrounded by the electric field reducing region and a surface of the electric field reducing region are exposed;
    forming a side wall along the opening portion of the etching mask such that an end portion of the side wall is located above the electric field reducing region; and
    etching the portion of the drift region and the inner portion of the electric field reducing region by using the etching mask and the side wall as a mask.

3. The method for manufacturing a semiconductor device according to claim 2, further comprising, after the forming a trench:
    forming a sacrificial oxide film by oxidizing the electric field reducing region exposed on the side surface of the trench; and
    removing the sacrificial oxide film by etching to leave the electric field reducing region only in a corner portion of a bottom portion of the trench.

4. The method for manufacturing a semiconductor device according to claim 2, wherein the forming a trench is forming the trench such that the side surface of the trench is tapered toward a bottom surface of the trench to enable etching of the electric field reducing region exposed on the side surface of the trench.

5. A method for manufacturing a semiconductor device comprising:
    forming a drift region of a first conductivity type on a first main surface of a semiconductor substrate;
    forming a trench in part of an upper portion of the drift region;
    forming an electric field reducing region of a second conductivity type, in an inner surface of the trench, only around a corner portion and not in a center portion;
    forming an anode electrode embedded in the trench and connected directly on a top surface of the drift region and a part of a side surface of the trench; and
    forming a cathode electrode on a second main surface of the semiconductor substrate which is opposite to the first main surface, wherein
    the electric field reducing region does not cover all of the side surface of the trench.

6. The method for manufacturing a semiconductor device according to claim 5, wherein
    the forming a trench uses an etching condition in which a micro trench is formed in the bottom portion of the trench, and
    the forming an electric field reducing region includes:
        forming the electric field reducing region in an inner surface of the trench by ion implantation; and
        leaving the electric field reducing region only in the corner portion of the bottom portion of the trench by removing the electric field reducing region exposed on a side surface and a bottom surface of the trench by etching.

7. The method for manufacturing a semiconductor device according to claim 6, wherein the leaving the electric field reducing region only in the corner portion of the bottom portion of the trench includes:
    forming a sacrificial oxide film by oxidizing the electric field reducing region exposed on the side surface and the bottom surface of the trench; and
    removing the sacrificial oxide film by etching.

8. The method for manufacturing a semiconductor device according to claim 5, wherein the forming an electric field reducing region is forming the electric field reducing region in a side surface and the corner portion of the bottom portion of the trench and not in the center portion by implanting ions into the side surface and the corner portion of the bottom portion of the trench in a direction oblique to a surface of the drift region.

9. A method for manufacturing a semiconductor device comprising:
    forming a drift region of a first conductivity type on a first main surface of a semiconductor substrate;
    forming a trench in part of an upper portion of the drift region;
    forming a sacrificial oxide on a side surface of the trench;
    forming an anode electrode by embedding the anode electrode inside the trench in which the sacrificial oxide is formed;
    removing the sacrificial oxide;
    forming an electric field reducing region of a second conductivity type in a bottom portion of the trench only around a corner portion thereof by implanting ions thereinto through a gap between the side surface of the trench and the anode electrode; and forming a cathode electrode on a second main surface of the semiconductor substrate which is opposite to the first main surface.

10. A method for manufacturing a semiconductor device comprising forming a drift region of a first conductivity type on a first main surface of a semiconductor substrate;

forming a trench in part of an upper portion of the drift region;

forming an electric field reducing region of a second conductivity type, in a bottom portion of the trench, only around a corner portion;

forming an anode electrode inside the trench and on the drift region;

doping a region of the anode electrode with a second conductivity type impurity by ion implantation, the region being embedded in the trench;

doping the anode electrode formed on the drift region in a region other than a region where the trench is formed, with a first conductivity type impurity, by ion implantation; and forming a cathode electrode on a second main surface of the semiconductor substrate which is opposite to the first main surface.

* * * * *